United States Patent
Mikhaylichenko et al.

(10) Patent No.: US 8,102,014 B2
(45) Date of Patent: *Jan. 24, 2012

(54) PROXIMITY HEAD HEATING METHOD AND APPARATUS

(75) Inventors: Katrina Mikhaylichenko, San Jose, CA (US); John deLarios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/886,278

(22) Filed: Sep. 20, 2010

(65) Prior Publication Data

US 2011/0008916 A1  Jan. 13, 2011

Related U.S. Application Data

(62) Division of application No. 10/816,487, filed on Mar. 31, 2004.

(51) Int. Cl.
 *H01L 21/66* (2006.01)
(52) U.S. Cl. .......................................... 257/414; 438/14
(58) Field of Classification Search .................... 438/14; 257/E21.529
See application file for complete search history.

(56) References Cited

U.S. PATENT DOCUMENTS

| | | | | |
|---|---|---|---|---|
| 5,696,348 | A * | 12/1997 | Kawamura et al. | 136/230 |
| 6,090,210 | A * | 7/2000 | Ballance et al. | 118/725 |
| 6,488,040 | B1 * | 12/2002 | de Larios et al. | 134/95.2 |
| 7,231,682 | B1 * | 6/2007 | Boyd et al. | 15/77 |
| 7,329,321 | B2 * | 2/2008 | Yun et al. | 134/15 |
| 7,354,622 | B2 * | 4/2008 | Shinriki et al. | 427/252 |
| 7,645,341 | B2 * | 1/2010 | Kennedy et al. | 118/715 |
| 2005/0221621 | A1 * | 10/2005 | Mikhaylichenko et al. | 438/745 |
| 2008/0142053 | A1 * | 6/2008 | O'Donnell | 134/30 |
| 2008/0260963 | A1 * | 10/2008 | Yoon et al. | 427/534 |

FOREIGN PATENT DOCUMENTS

| | | | |
|---|---|---|---|
| JP | 08277486 A | * | 10/1996 |
| JP | 2001220688 A | * | 8/2001 |

OTHER PUBLICATIONS

Machine Generated English Translation of JP 2001-220688. Published Aug. 2001.*
Machine Generated English Translation of JP 08-277486. Published Oct. 1996.*

* cited by examiner

Primary Examiner — Sylvia R. MacArthur
(74) Attorney, Agent, or Firm — Martine Penilla Group, LLP

(57) ABSTRACT

Provided is an apparatus and a method for heating fluid in a proximity head. A method for semiconductor wafer processing, includes providing liquid to a proximity head including a heating portion, heating the liquid within the heating portion of the proximity head and delivering the heated liquid to a surface of a semiconductor wafer for use in a wafer processing operation including forming a meniscus between the proximity head and the surface of the semiconductor wafer.

17 Claims, 7 Drawing Sheets

PROXIMITY HEAD HEATING METHOD AND APPARATUS

CROSS REFERENCE TO RELATED APPLICATIONS

This application is a divisional of and claims priority from U.S. patent application Ser. No. 10/816,487 filed on Mar. 31, 2004 and entitled "Proximity Head Heating Method and Apparatus," which is incorporated herein by reference in its entirety.

BACKGROUND

1. Field of the Invention

The present invention relates to semiconductor wafer processing systems, and more specifically, to heating fluids in a proximity head.

2. Description of the Related Art

Semiconductor wafer fabrication typically involves multiple repeated fabrication steps, such as implantation, material deposition, planarization, and etching. After each fabrication step, residue can remain on a surface of a semiconductor wafer. Thus, between the fabrication steps, a cleaning step is typically used to remove particulates and other undesirable material that remain on the surface of the semiconductor wafer. Exemplary particulates can include silicon dust, silica, slurry residue, metal flakes, and silicate particles.

The cleaning step can include a rinse step, a spin step, and a dry step. During the rinse step, a fluid delivery device, such as a spray device or an immersion device, can apply a cleaning fluid to wet the surface of the semiconductor wafer. For example, the cleaning fluid can be sprayed onto the surface of the semiconductor wafer with the spray device. Alternatively, the semiconductor wafer can be immersed in the cleaning fluid within the immersion device. After the rinse step, the semiconductor wafer can be rotated to spin off the particulates along with the cleaning fluid. Subsequently, a drying step can dry remaining droplets on the surface of the semiconductor wafer. During the cleaning step or other semiconductor wafer fabrication steps, it may be desirable to heat the fluid applied to the surface of the semiconductor wafer.

Typical heating mechanisms for semiconductor wafer processing systems have included a heater connected to a fluid source. The fluid source delivers fluid, such as the cleaning fluid, to the heater, which heats the cleaning fluid to some desired temperature. Subsequently, the heated cleaning fluid propagates to the spray device or the immersion device.

However, using the steps previously described in current semiconductor wafer processing systems may be inefficient. For example, the heated cleaning fluid may experience heat loss while traveling from the heater to the fluid delivery device. Thus, when the heated cleaning fluid touches the surface of the semiconductor wafer, the temperature of the heated cleaning fluid may be lower than the desired temperature.

In view of the foregoing, what is needed is an apparatus and a method for heating fluid in a semiconductor wafer processing system that enables heated fluid to be delivered to a semiconductor wafer at a desired temperature.

SUMMARY OF THE INVENTION

Broadly speaking, the present invention is an apparatus and a method for heating a fluid in a proximity head. It can be appreciated that the present invention can be implemented in numerous ways, such as a process, an apparatus, a system, or a device. Several inventive embodiments of the present invention are described below.

One embodiment of a method for semiconductor wafer processing includes providing fluid to a proximity head and heating the fluid within the proximity head. The method also includes delivering the heated fluid to a surface of a semiconductor wafer for use in a wafer processing operation.

In an embodiment of a proximity head for semiconductor wafer processing, the proximity head includes a heating portion that is configured to raise a temperature of a fluid flowing therethrough. The proximity also includes a sensor disposed within the proximity head for measuring the temperature of the fluid flowing through the heating portion and a channel disposed in the heating portion, such that the channel is configured to guide the fluid through the heating portion. Further, the proximity head includes a bottom surface having at least one outlet port and at least one inlet port, such that the at least one outlet port is in flow communication with the channel disposed in the heating portion.

In an embodiment of a semiconductor wafer processing system, the system includes a fluid source and a proximity head in flow communication with the fluid source. Further, the proximity head includes a heating portion configured to raise a temperature of a fluid flowing therethrough and a sensor disposed within the proximity head for measuring the temperature of the fluid flowing through the heating portion. The proximity head also includes a channel disposed in the heating portion, such that the channel is configured to guide the fluid through the heating portion. The proximity head further includes a bottom surface with at least one outlet port and at least one inlet port, such that the at least one outlet port is in flow communication with the channel disposed in the heating portion. The embodiment of the system also includes a first member connected to the proximity head, such that the first member is configured to manipulate the proximity head and a second member configured to support a wafer. The second member is capable of placing the semiconductor wafer proximate to the bottom surface of the proximity head.

Other aspects of the invention will become apparent from the following detailed description, taken in conjunction with the accompanying drawings, illustrating by way of example the principles of the invention.

BRIEF DESCRIPTION OF THE DRAWINGS

Embodiments of the invention may best be understood by reference to the following description taken in conjunction with the accompanying drawings in which.

DETAILED DESCRIPTION

The following embodiments describe an apparatus and a method for heating fluid for delivery to a surface of a semiconductor wafer in a semiconductor wafer processing system. An exemplary semiconductor wafer processing system includes a proximity head, as disclosed in U.S. patent application Ser. No. 10/261,839, entitled, "Method and Apparatus for Drying Semiconductor Wafer Surfaces Using a Plurality of Inlets and Outlets Held in Close Proximity to the Wafer Surfaces," and filed on Sep. 30, 2002, which is incorporated by reference in its entirety. The proximity head illustrated by the drawings herein is exemplary, and other embodiments can include the proximity head having any shape, as long as the proximity head can heat fluid.

It will be obvious, however, to one skilled in the art, that the present invention may be practiced without some or all of these specific details. In other instances, well known process operations have not been described in detail in order not to unnecessarily obscure the present invention. Further, the embodiments described herein are exemplary. It will be appreciated by those skilled in the art that upon reading the description and studying the drawings, various alterations, additions, permutations and equivalents thereof are possible. It is therefore intended that all such alterations, additions, permutations, and equivalents fall within the true spirit and scope of the disclosed embodiments.

Figure 1A:
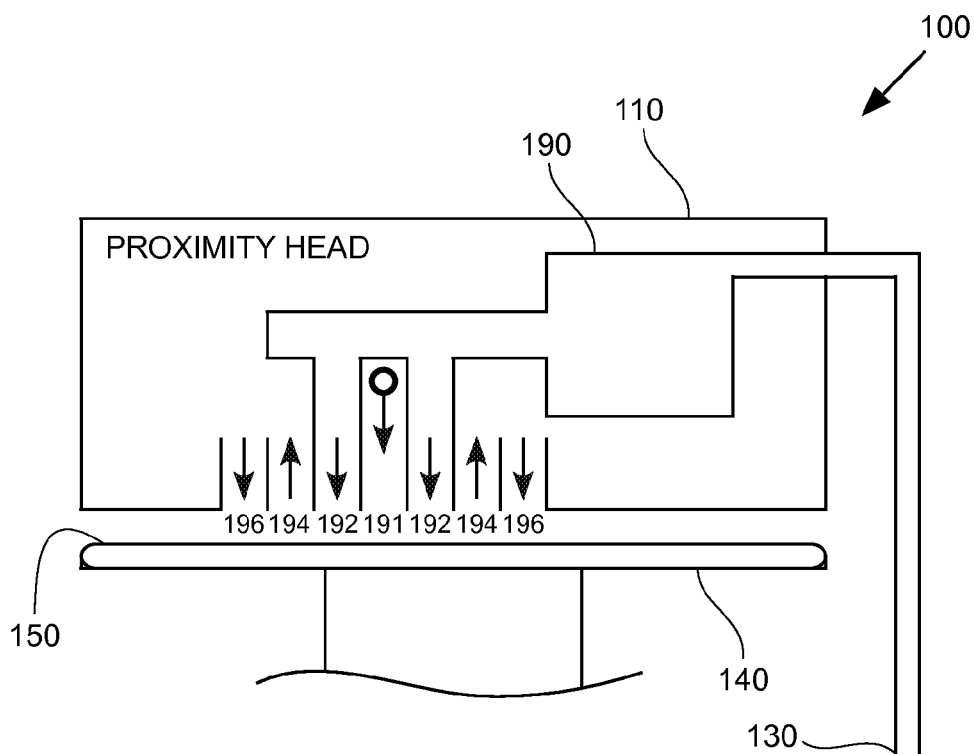
FIG. 1A is a side view diagram illustrating a proximity head with a heating portion, in accordance with an embodiment of the invention.

FIG. 1A is a side view diagram illustrating a proximity head 110 with a heating portion 190, in accordance with an embodiment of the invention. In an exemplary semiconductor wafer processing system 100, the proximity head 110 is connected via a connector 130 to a fluid source 120. The fluid source 120 provides a fluid used in semiconductor wafer fabrication operations. Exemplary fluids can include water, deionized water (DIW), a chemistry, a combination of the chemistry and DIW, and a combination of the chemistry and water. However, it will be apparent to one skilled in the art that any fluid suitable for use in semiconductor wafer processing may be used in semiconductor wafer processing system 100.

Although FIG. 1A illustrates the fluid source 120 as having the connector 130 to guide the fluid to the proximity head 110, another embodiment can couple the fluid source 120 directly to the proximity head 110. After the proximity head 110 receives the fluid, the fluid flows into the heating portion 190. The heating portion 190 heats the fluid to a set temperature. Further, the proximity head 110 controls the temperature of the fluid by applying heat or waiting, until the fluid in the heating portion 190 reaches the set temperature. Upon reaching the set temperature, the fluid flows through one or more outlet ports on a bottom surface of the proximity head 110. The heated fluid then touches a surface of a wafer 150 that is positioned by a wafer holder 140. The wafer holder 140 is capable of supporting the wafer 150 proximate to the bottom surface of the proximity head 110.

In some embodiments, substrates can be processed during semiconductor wafer fabrication operations. For example, substrates can take on different shapes, such as square or rectangular shapes, as are used in flat panel substrates. However, for simplicity, reference will be made to a circular wafer, such as the wafer 150. Further, the wafer 150 can rotate or move linearly with respect to the proximity head 110. The actual diameter of the wafer 150 can vary. Current examples include 200 mm wafers and 300 mm wafers. However, to those of ordinary skill in the art, any wafer size and shape is possible, as long as the wafer 150 can be placed proximate to the bottom surface of the proximity head 110.

The heated fluid delivered to the wafer 150 via a first outlet port 192 can combine with an unheated fluid delivered by a second outlet port 191. Correspondingly, a third outlet port 196 can deliver isopropyl alcohol (IPA) while a vacuum inlet port 194 removes all the fluids from the surface of the wafer 150. In some embodiments, the third outlet port 196 may not deliver IPA. Thus, in some embodiments, the vacuum inlet port 194 only removes the heated fluid and the unheated fluid. Any fluid delivered to the surface of the wafer 150 can have any footprint. For example, the fluid footprint can be about two square inches. However, any fluid footprint is possible, as long as the fluid is removed from the surface of the wafer 150 by the vacuum port 194.

Figure 1B:
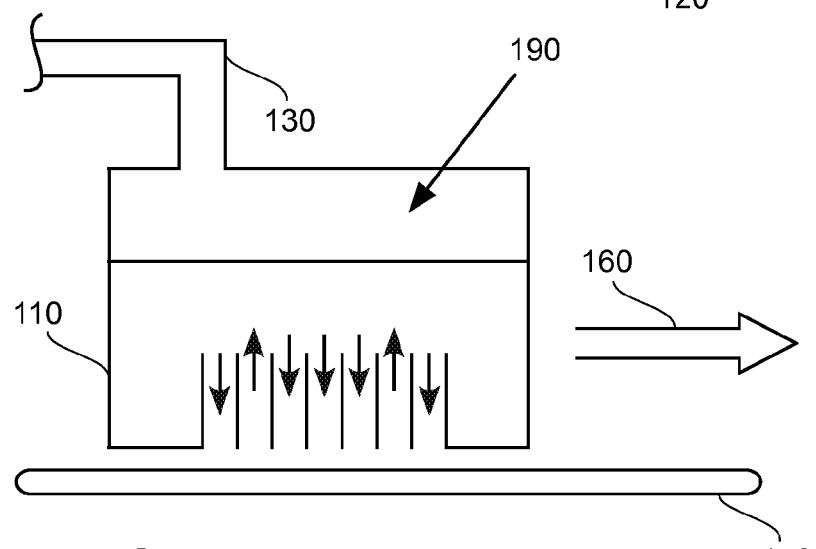
FIG. 1B is a side view diagram illustrating another proximity head with a heating portion, in accordance with an embodiment of the invention.

In some embodiments, the wafer 150 may be stationary, while the proximity head 110 moves with respect to the wafer 150. For example, FIG. 1B is a side view diagram illustrating another proximity head 110 with the heating portion 190, in accordance with an embodiment of the invention. The proximity head 110 can move in a direction 160 over the surface of the wafer 150. During movement, the proximity head 110 delivers fluid heated by the heating portion 190 via a plurality of ports disposed on the bottom surface of the proximity head 110. Of course, to one of ordinary skill in the art, the proximity head 110 can move in any direction, as long as the proximity head 110 does not collide with the wafer 150.

Figure 1C:
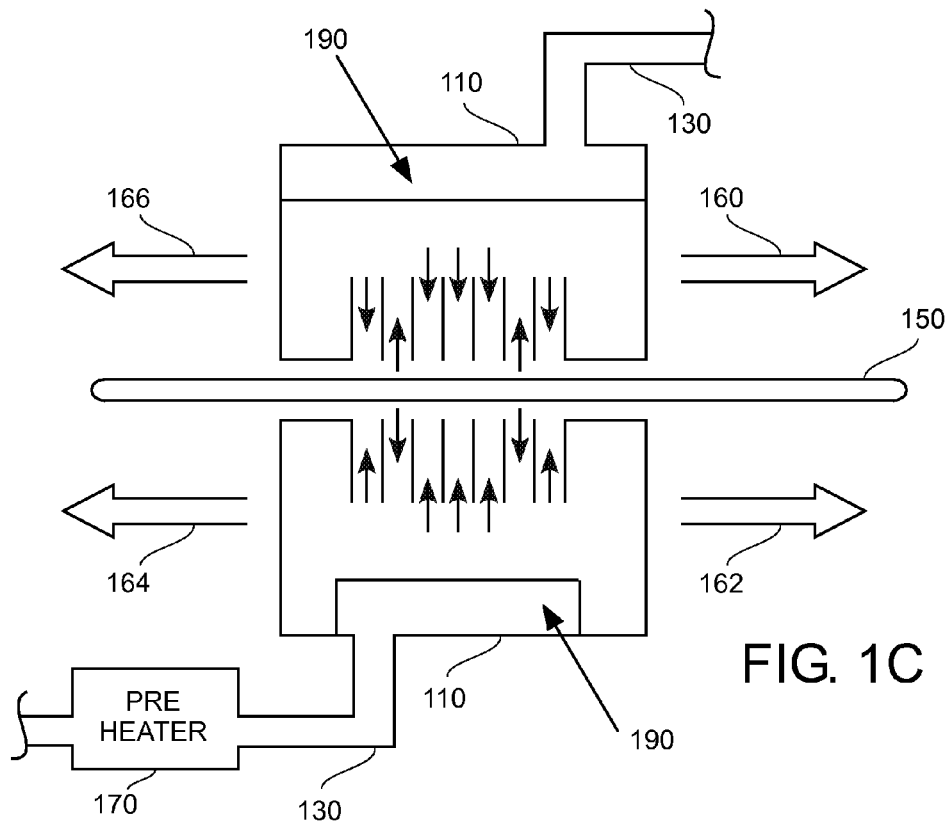
FIG. 1C is a side view diagram illustrating a semiconductor wafer processing system with dual proximity heads, in accordance with an embodiment of the invention.

Although one proximity head 110 can deliver fluid to one surface of the wafer 150, FIG. 1C is a side view diagram illustrating a semiconductor wafer processing system 100 with dual proximity heads, in accordance with an embodiment of the invention. The proximity heads 110 can move in the directions indicated, such as the direction 160. However, proximity heads 110 can differ, such as illustrated by the dual proximity heads. For example, the upper depicted proximity head 110 depicts the heating portion 190 covering an entire upper portion of the proximity head 110. Alternatively, the lower depicted proximity head 110 depicts the heating portion 190 as covering a portion of the upper portion of the proximity head 110. Further, the lower depicted proximity head 110 is coupled to a pre-heater 170. The pre-heater 170 is capable of raising the temperature of the fluid about to flow into the heating portion 190. Then, a pre-heated fluid flows in the heating portion 190 for final heating to the set temperature. Thus, the pre-heater 170 enables the fluid to reach higher temperatures. Further, by pre-heating the fluid, the proximity head 110 can better control heating of the pre-heated fluid in a shorter amount of time.

Figure 1D:
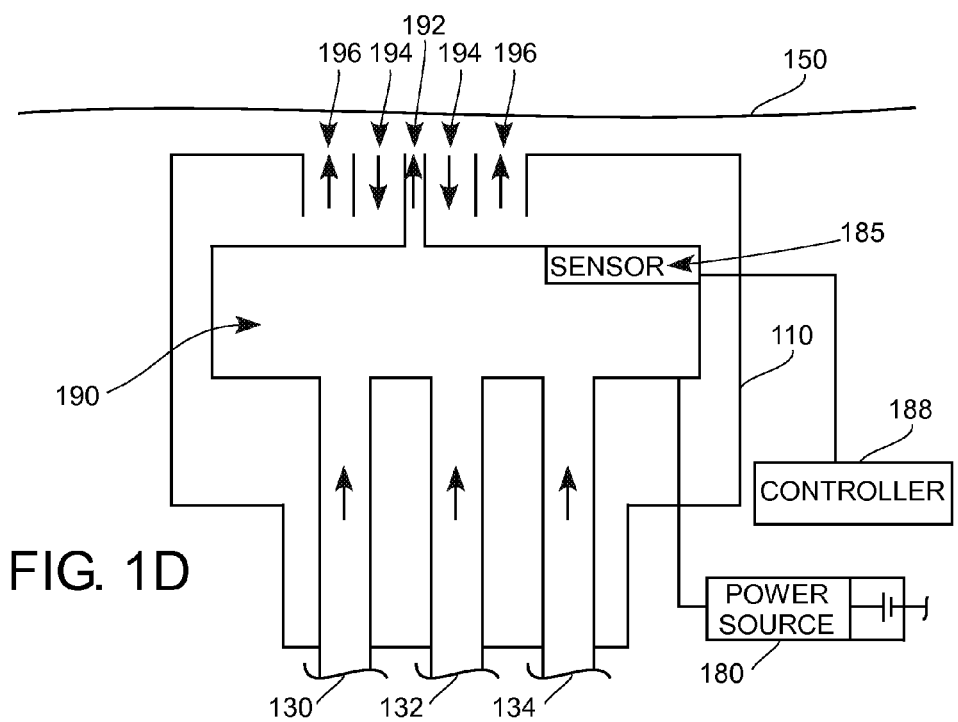
FIG. 1D is a side view diagram illustrating a semiconductor wafer processing system with a proximity head coupled to a power source, in accordance with an embodiment of the invention.

FIG. 1D is a side view diagram illustrating the semiconductor wafer processing system 100 with the proximity head 110 coupled to a power source 180, in accordance with an embodiment of the invention. In contrast with the proximity head having a plurality of outlet ports for delivering the heated fluid, another embodiment can deliver the heated fluid to the surface of the wafer 150 via one outlet port 192. The heating portion 190 is disposed within some portion of the proximity head 110. As illustrated by FIGS. 1A through 1D and subsequent drawings, the heating portion 190 can be any size and shape. Further, the heating portion 190 can encompass a portion or an entire area of the proximity head 110. Moreover, although the heating portion 190 is fully disposed in the proximity head 110, other embodiments can partially dispose (not shown) the heating portion 190 in the proximity head 110. However, the size and shape of the heating portion 190 can be disposed in the proximity head 110 in any manner, as long as the heating portion 190 is configured to heat the fluid and deliver the heated fluid to the wafer 150.

Fluids can flow into the heating portion 190 via connectors, such as the connector 130. Further, one or more connectors can deliver multiple fluids into the heating portion 190. For example, fluids for a cleaning operation can flow into the connector 130, which can be referred to as the first connector 130. Correspondingly, fluids, such as an etching chemistry for an etching operation, can flow into a second connector 132 and fluids for a plating operation can flow into a third connector 134. Of course, to one of ordinary skill in the art, one or more connectors can be used for any amount and types of fluids. For example, DIW can flow into the first connector 130 and the chemistry can flow into the second connector 132. Thus, any number of connectors can introduce fluid to the heating portion 190, as long as the heating portion 190 is configured to heat the fluid.

Figure 5:
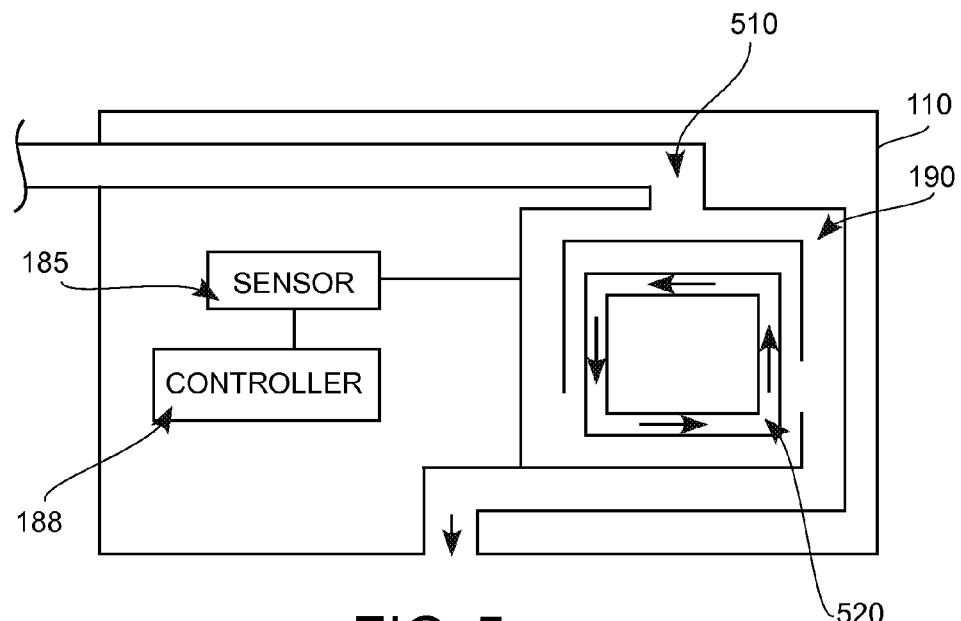
FIG. 5 is a side view diagram illustrating a heating portion of a proximity head having a circulating fluid, in accordance with an embodiment of the invention.
Figure 6:
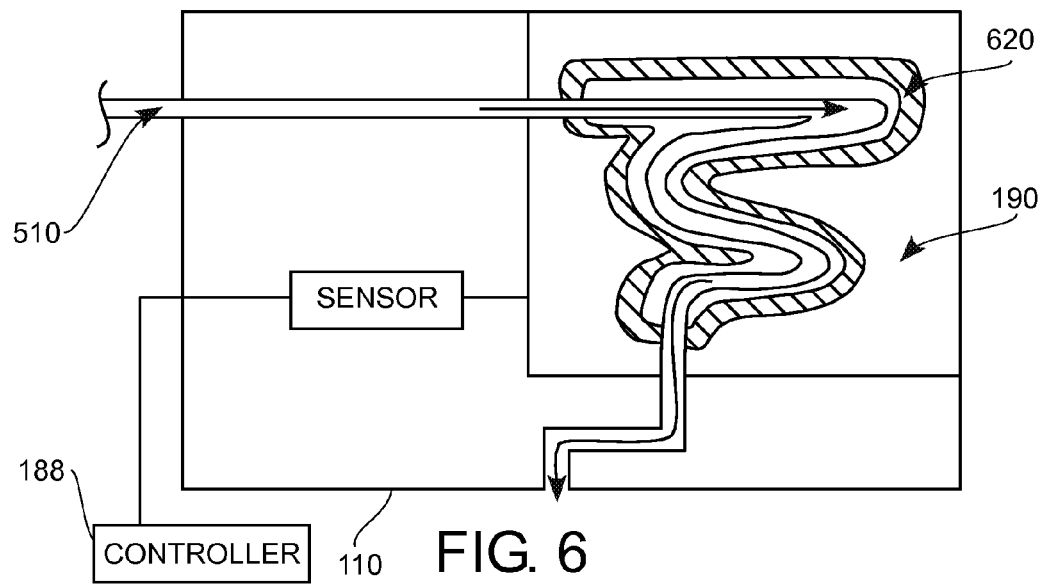
FIG. 6 is another side view diagram illustrating a heating portion of another proximity head having a circulating fluid, in accordance with an embodiment of the invention.

The proximity head 110 is connected to the power source 180. The power source 180 introduces a current into the proximity head 110. An electrically conductive material propagates the current into the heating portion 190 in order to heat the fluid. Other embodiments may not include the power source 180. For example, as shown by FIGS. 5 and 6, the power source 180 is not required to heat the fluid in the heating portion 190. If heating fluid with the power source 180, then the power source 180 can produce about 3 kW to heat the fluid. However, this value is purely exemplary, and any other value is possible, as long as the power source 180 can produce enough power to heat the fluid in the heating portion 190.

In other exemplary embodiments, any type of power source 180 is possible that does not involve electricity. For example, lasers are known to heat surfaces of objects. Thus, any type of power source 180 is possible, as long as the power source 180 is capable of applying heat to the heating portion 190.

An embodiment also includes a sensor 185 and a controller 188. The sensor 185 is disposed in the proximity head 110 for measuring the temperature of the fluid flowing through the heating portion 190. Further, the sensor 185 can be disposed in the heating portion 190 or can be disposed external to the heating portion 190. To one of ordinary skill in the art, the sensor 185 can be disposed in any location, as long as the sensor 185 can measure the temperature of the fluid. In one embodiment, the sensor 185 is a thermocouple. However, any type of sensor 185 is possible, as long as the sensor can measure the temperature of the fluid.

Coupled to the sensor 185 is the controller 188. The controller 188 is configured to control the temperature of the fluid in the heating portion 190. For example, a proportional integral differential (PID) controller can control the temperature of the fluid. After setting the set temperature, which is a temperature of the fluid that should reach the surface of the wafer 150, the controller 188 can detect the difference between a current temperature of the fluid and the set temperature by obtaining measurements from the sensor 185. The controller 188 then determines the amount of current to apply to the heating portion 190 from the power source 180.

Software in a computing system connected to the controller 188 can also manage the controller 188. For example, during operation, the software can establish the set temperature at 60° C. The sensor 185 can measure the fluid temperature and determine if the fluid temperature is less than 60° C. The software can then use the controller 188 to detect a temperature difference and apply current as needed. If the fluid temperature is greater than 60° C., then the software can do nothing and wait for the fluid to reach the set temperature. To those of ordinary skill in the art, the amount of current to apply and the waiting time for cooling can be programmed into the software. In other embodiments, any method of controlling the fluid temperature is possible, whether using hardware or software, as long as the heating portion 190 in the proximity head 110 increases the temperature of the fluid.

Figure 2:
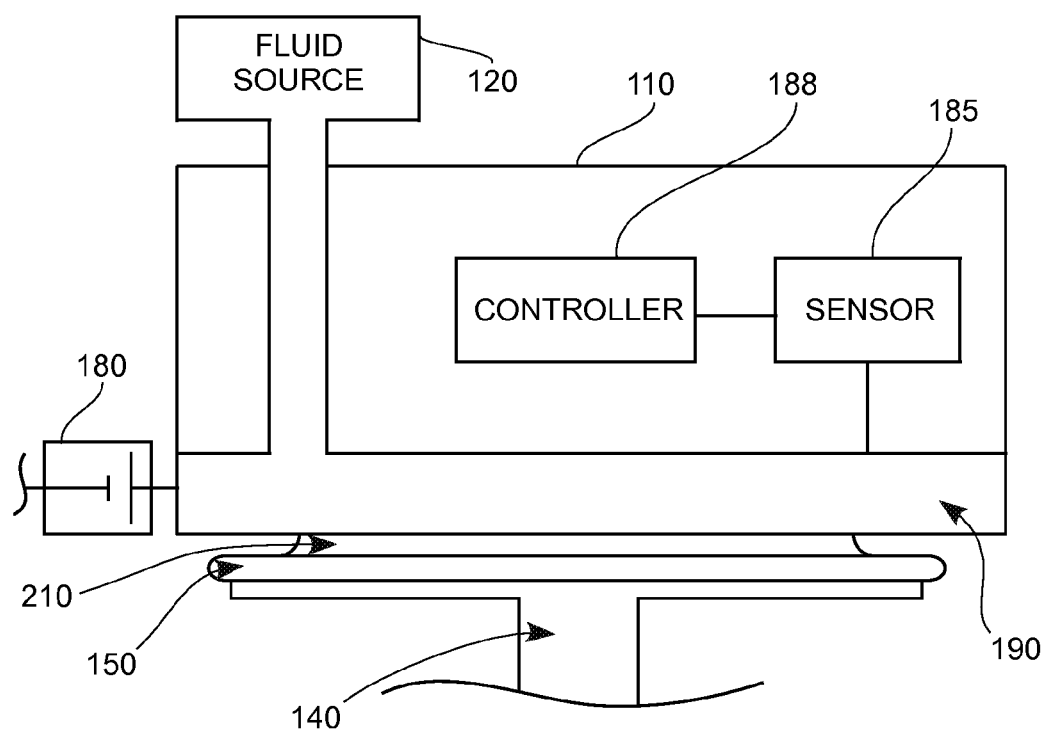
FIG. 2 is a side view diagram illustrating a proximity head having a resistive heating element, in accordance with an embodiment of the invention.

FIG. 2 is a side view diagram illustrating the proximity head 110 having a resistive heating element, in accordance with an embodiment of the invention. The heating portion 190 can be comprised of a resistive heating element. Exemplary resistive heating elements can include materials such as silicon carbide (SiC), molybdenum disilicide ($MoSi_2$), or other electrically conductive materials. An exemplary material such as silicon carbide is capable of being heated above about 100° C. However, the resistive heating element can be any material, as long as the material is capable of being heated to equal or greater than the set temperature.

As illustrated in FIG. 2, the resistive heating element can comprise a portion of the proximity head 110. For example, a portion near the bottom surface of the proximity head 110 can heat the fluid before delivery to the surface of the wafer 150. In other embodiments, the entire proximity head 110 can be composed of the resistive heating element. Thus, any composition and configuration of the resistive heating element is possible, as long as the resistive heating element is capable of heating the fluid.

The embodiments described herein generate a fluid meniscus 210 between the proximity head 110 and the surface of the wafer 150. The fluid meniscus 210 may be moved across the wafer 150 to clean and dry the wafer 150 in relation to semiconductor wafer fabrication operations. For example, the fluid meniscus 210 including the heated fluid may be applied in etching and plating operations. To those of ordinary skill in the art, the fluid meniscus 210 including the heated fluid can be applied in any semiconductor wafer fabrication operation, as long as the proximity head 110 heats the fluid.

As the fluid source 120 delivers fluid to the heating portion 190 for heating, the sensor 185 measures the temperature of the fluid. One or more temperature measurements, in conjunction with the controller 188, control the temperature of the fluid. The amount of time, from the delivery of the fluid to the proximity head 110, to the delivery of the heated fluid to the wafer 150, varies. For example, it may take a longer time to raise the temperature of the fluid to the set temperature than to wait for the fluid temperature to lower to the set temperature. Thus, any amount of time is possible, as long as the temperature of the fluid reaches the set temperature before delivery of the heated fluid to the wafer 150.

For the fluid meniscus 210 having a temperature from about 40° C. to about 95° C., the heated fluid includes predominantly water-based chemistries such as DIW. However, in other embodiments, other chemistries are possible. For example, during a plating operation as disclosed by U.S. patent application Ser. No. 10/607,611, entitled, "Apparatus and Method for Depositing and Planarizing Thin Films of Semiconductor Wafers," and filed on Jun. 27, 2003, which is hereby incorporated by reference in its entirety, the fluid meniscus 210 can deliver the heated fluid including a plating chemistry to the surface of the wafer 150.

Figure 3:
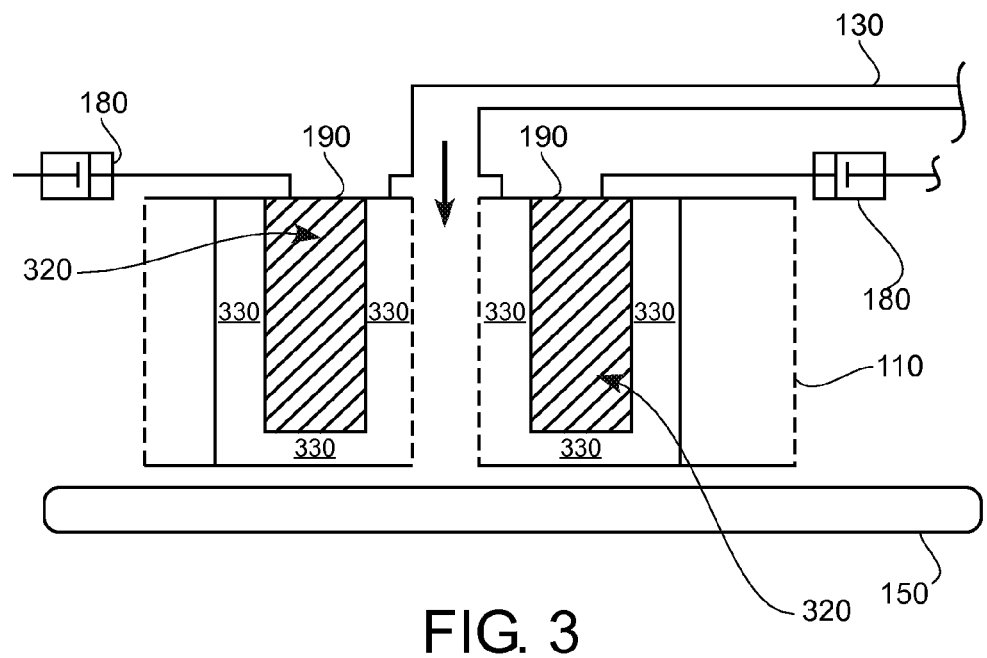
FIG. 3 is a side view diagram illustrating another proximity head having a resistive heating element, in accordance with an embodiment of the invention.

After applying current to the heating portion 190, electron transfer may affect the fluid. For example, FIG. 3 is a side view diagram illustrating another proximity head 110 having a resistive heating element 330, in accordance with an embodiment of the invention. The proximity head 110 includes two heating portions 190 comprised of the resistive heating element 320 and an insulator 330. As current is applied to the resistive heating element 320, the insulator 330 prevents electron transfer to the fluid, which is delivered to the surface of the wafer 150. Examples of the insulator 320 include polytetrafluoroethylene (PTFE), commonly known as Teflon® and a sapphire material. PTFE can be a coating covering the resistive heating element 320, while the sapphire material can be plates that separate the resistive heating element from the fluid. However, any type of insulator is possible, as long as the insulator 330 is capable of preventing electron transfer to the fluid.

As illustrated by the embodiment of FIG. 3, the heating portion 190 can surround an outlet port. Further, although shown as a vertical heating portion 190, horizontal heating portions 190 surrounding channels that guide fluid are possible, as long as the heating portions 190 heat fluid in the channels. Alternative embodiments can surround selected outlet ports, thereby permitting the selective heating of fluids.

Figure 4:
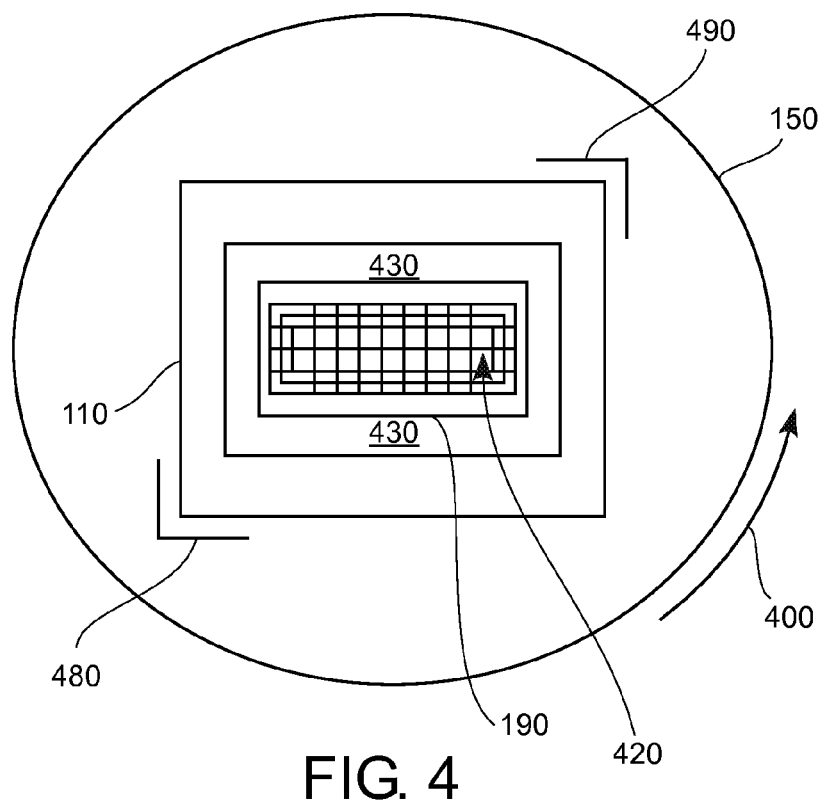
FIG. 4 is a top view diagram illustrating a heating portion of a proximity head having wires, in accordance with an embodiment of the invention.

FIG. 4 is a top view diagram illustrating the heating portion 190 of the proximity head 110 having wires 420, in accordance with an embodiment of the invention. The resistive heating element can also include bulk resistors, such as the wires 420. The wires 430 can be a net of wires, or can have a non-uniform shape. Regardless of the configuration of the wires 420, the wires 420 are also insulated to prevent electron transfer to the fluid. For example, an insulator 430, such as ceramic, can insulate the fluid from the wires 420. As current is applied to the wires 420, the fluid flowing through the heating portion 190 is heated to the set temperature. When the heated fluid reaches the surface of the wafer 150, the proximity head 110 forms the fluid meniscus 210 (see FIG. 2). Thus, as the wafer rotates in a direction 400, a leading edge 480 produces a wet region of the wafer 150 and a trailing edge 490 produces a dry region of the wafer 150. The wet region is produced by the delivery of the heated fluid to the wafer 150. Correspondingly, the movement of the wafer 150 and the proximity head 110, in conjunction with the vacuuming of the heated fluid into the proximity head 110, produces the dry region.

FIG. 5 is a side view diagram illustrating the heating portion 190 of the proximity head 110 having a circulating fluid, in accordance with an embodiment of the invention. In an exemplary embodiment, a first channel 510 can guide fluid to the heating portion 190 disposed in the proximity head 110. Within the heating portion 190, a second channel 520 circulates the circulating fluid, thereby preventing the fluid in the first channel 510 and the circulating fluid in the second channel 520 from mixing. The circulating fluid can raise the temperature of the fluid delivered from the first channel 510 via heat exchange. Exemplary circulating fluids can be water-based chemistries that are supplied by a pump (not shown). However, other embodiments can exchange the circulating fluid with a new circulating fluid when the circulating fluid loses the ability to apply heat. Accordingly, any method of introducing and managing the circulating fluid is possible, as long as the heating portion 190 can heat fluid.

In another exemplary embodiment, a resistive heating element, such as silicon carbide, can be combined with channels for heat exchange. In such an embodiment, there is no power source 180 and thus, there is no current applied to the SiC. Silicon carbide is capable of high thermal conductivity. Thus, at least one second channel 520 can circulate fluid for heat exchange because the second channel 520 is embedded in a material that transfers heat well. However, if a material has low thermal conductivity, such as ceramic, then a network of second channels 520 may be required to perform the heat exchange.

Other than the exclusion of the power source 180 in FIG. 5, the proximity head 110 also does not include electrical insulation. Specifically, because the circulating fluid provides heat to the fluid, electron transfer does not occur from a nonexistent current. Of course, if a heating portion 190 combined the power source 180 with channels for circulating fluid, then the proximity head 110 may include insulation.

FIG. 6 is another side view diagram illustrating the heating portion 190 of another proximity head 110 having the circulating fluid, in accordance with an embodiment of the invention. Specifically, in contrast with the second channel 520, the second channel 620 of this exemplary embodiment has a non-uniform shape. Further, a space can separate the second channel 620 from the first channel 510. When the fluid flows through the first channel 510 into the heating portion 190, the circulating fluid in the second channel 620 exchanges heat with the fluid in the first channel 510. Because of the space separating the two channels, the material surrounding the two channels can be a material having high thermal conductivity.

Any method of heating fluid is possible. For example, FIGS. 2 through 4 illustrate methods of heating using resistive heating elements. Alternatively, FIGS. 5 and 6 illustrate exemplary methods of heating using a heat exchanger. Further, exemplary combinations of resistive heating and heat exchange are possible. Accordingly, any method of heating fluid is possible, as long as the fluid is heated within the heating portion 190 of the proximity head 110.

Figure 7A:
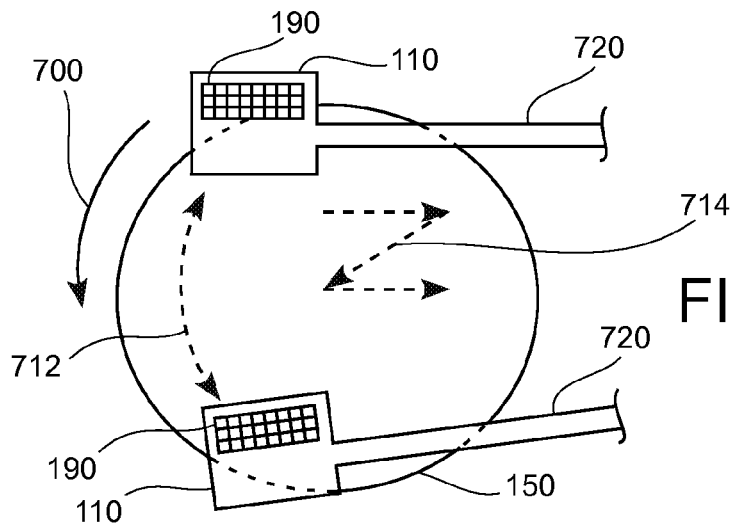
FIG. 7A is a top view diagram illustrating a proximity head scanning method, in accordance with an embodiment of the invention.

To apply the heated fluid to the surface of the wafer 150, the proximity head 110 can move with respect to the wafer 150. For example, FIG. 7A is a top view diagram illustrating a proximity head scanning method, in accordance with an embodiment of the invention. The proximity head 110 can include a heating portion 190. Further, the proximity head 110 can be coupled to a member manipulating the proximity head 110. For example, the member can be an arm 720 capable of supplying fluids, removing fluids, and moving the proximity head 110. For example, the arm 720 can move the proximity head 110 along a radial direction 712. Alternatively, the arm 720 can move the proximity head in a raster scan direction 714.

Figure 7B:
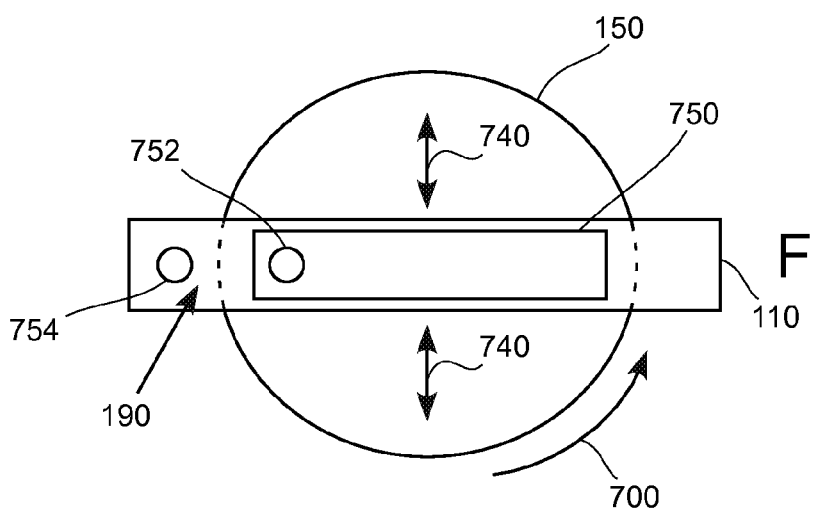
FIG. 7B is a top view diagram illustrating another proximity head scanning method, in accordance with an embodiment of the invention.

Alternatively, FIG. 7B is a top view diagram illustrating another proximity head scanning method, in accordance with an embodiment of the invention. In one embodiment, the proximity head 110 can be longer than the diameter of the wafer 150. Thus, a circulating fluid can be delivered to a second channel 754 and the fluid to be heated can be delivered to a first channel 752. Thus, the proximity head 110 moves in a vertical direction 740 when delivering the heated fluid to the surface of the wafer 150. Of course, a horizontal direction (not shown) is possible when the proximity head 110 has a vertical orientation. Moreover, with regard to FIGS. 7A and 7B, any method of scanning the wafer 150 is possible, as long as the proximity head 110 can deliver the heated fluid to the surface of the wafer 150.

Figure 7C:
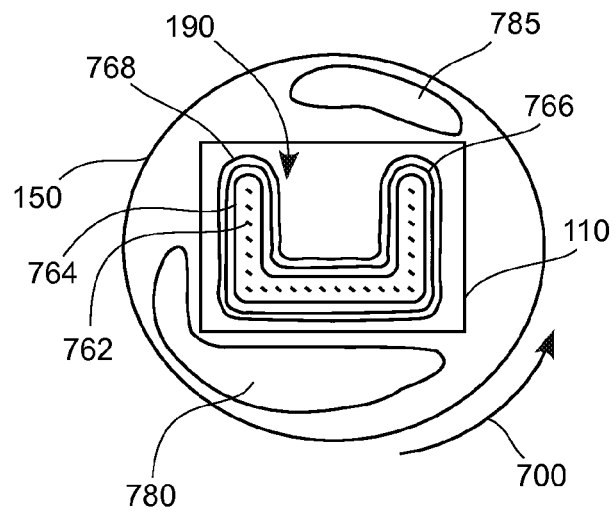
FIG. 7C is a top view diagram illustrating regions of a wafer in use with the heating portion of a proximity head, in accordance with an embodiment of the invention.

FIG. 7C is a top view diagram illustrating regions of the wafer 150 in use with the heating portion 190 of the proximity head 110, in accordance with an embodiment of the invention. In one embodiment, the proximity head 110 includes a plurality of ports for delivering and removing fluids. For example, the body of the proximity head 110 can be comprised of silicon carbide. Embedded within the silicon carbide are the plurality of ports, such as a first port 762, a second port 764, a third port 766, and a fourth port 768. For example, a first port 762 can deliver a chemistry while the second port 764 can deliver DIW. The third port 766 can be a vacuum and the fourth port 768 can deliver IPA. In other embodiments, any amount and combination of ports are possible, as long as the plurality of ports can delivery a heated fluid from the proximity head 110.

As the wafer 150 rotates in direction 700, the proximity head 110 delivers the heated fluid to produce a wet region 780. The proximity head 110 produces a dry region 785 by vacuuming the heated fluid from the surface of the wafer 150. Further, as the wafer 150 rotates, heated fluid may spin off the surface of the wafer 150. Thus, any method of producing the wet region 780 and the dry region 785 is possible, as long as the proximity head 110 can move in a particular scanning method in relation to the movement of the wafer 150.

Figure 8:
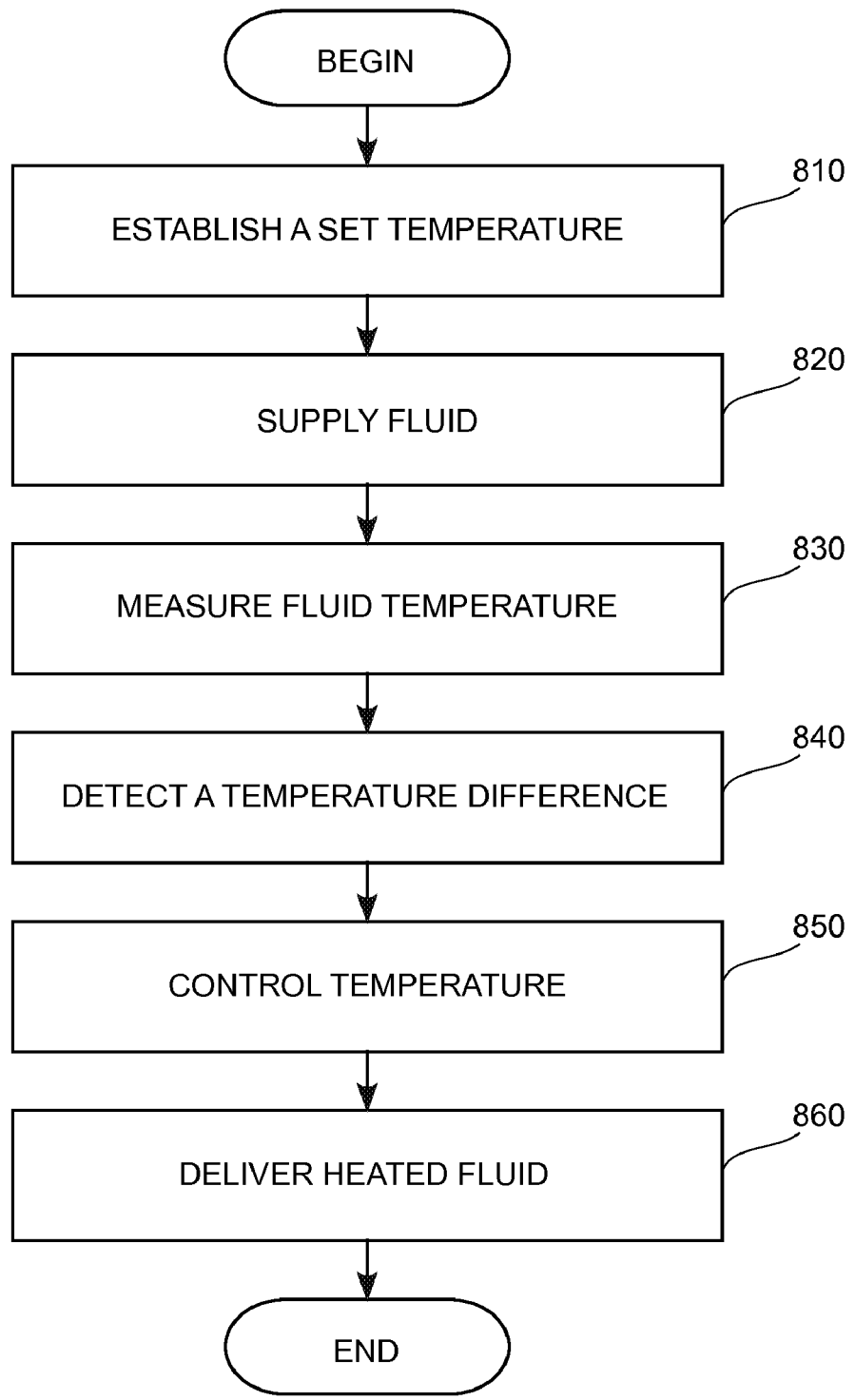
FIG. 8 is a flowchart diagram illustrating operations for heating fluid in a proximity head, in accordance with an embodiment of the invention.

FIG. 8 is a flowchart diagram illustrating operations for heating fluid in the proximity head 110, in accordance with an embodiment of the invention. The following exemplary operations can be performed in the embodiments previously disclosed in FIGS. 1D through 4. In an exemplary operation beginning with operation 810, a set temperature is established. Then, in operation 820, the fluid source 120 can supply fluid to the proximity head 110. After the fluid reaches the proximity head 110, the sensor 185 within the proximity head 110 can measure the fluid temperature, in operation 830. The controller 188 can then detect a temperature difference between the current fluid temperature and the set temperature, in operation 840. In operation 850, the controller 188 can also control the temperature by applying heat or by waiting.

For example, in a resistive heating method, the heating portion 190 can include wires 420 and materials such silicon carbide, coupled to a power source 180. The power source 180 can apply a current to the heating portion 190 to heat fluid flowing therethrough. Alternatively, multiple channels having circulating fluid can exchange heat with the fluid to be heated. Regardless of the method for heating fluid, the controller 188 can adjust the fluid temperature until the fluid temperature matches the set temperature.

Then, in operation 860, the proximity head 110 delivers the heated fluid through the outlet ports located on the bottom surface of the proximity head 110. The heated fluid is used in multiple semiconductor wafer fabrication operations, such as cleaning and etching operations. Thereafter, after the heated fluid is removed from the surface of the wafer 150, the operations end.

To those of ordinary skill in the art, the operations described herein, and illustrated by the drawings, are exemplary. Further, the operations can be performed in any order to permit the heating of the fluid in the proximity head 110. For example, the sensor 185 can continually measure the temperature of the fluid in parallel with the supply of fluid. Thus, the order of the operations is not limited to any particular sequence.

Moreover, the embodiments described herein are related to the following patent applications. Specifically, the following related applications are hereby incorporated by reference in their entirety: 1) U.S. patent application Ser. No. 10/330,843, entitled, "Meniscus, Vacuum, IPA Vapor, Drying Manifold," filed on Dec. 24, 2002, 2) U.S. patent application Ser. No. 10/330,897, entitled, "System for Substrate Processing with Meniscus, Vacuum, IPA Vapor, Drying Manifold," filed on Dec. 24, 2002, 3) U.S. patent application Ser. No. 10/404,270, entitled, "Vertical Proximity Processor," filed on Mar. 31, 2003, 4) U.S. patent application Ser. No. 10/404,692, entitled, "Methods and Systems for Processing a Substrate Using a Dynamic Liquid Meniscus," filed on Mar. 31, 2003, 5) U.S. patent application Ser. No. 10/603,427, entitled, "Methods and Systems for Processing a Bevel Edge a Substrate Using a Dynamic Liquid Meniscus," filed on Jun. 24, 2003, 6) U.S. patent application Ser. No. 10/606,022, entitled, "System and Method for Integrating In-Situ Metrology Within a Wafer Process," filed on Jun. 24, 2003, 7) U.S. patent application Ser. No. 10/611,140, entitled, "Method and Apparatus for Cleaning a Substrate Using Megasonic Power," filed on Jun. 30, 2003, and 8) U.S. patent application Ser. No. 10/742,303, entitled, "Proximity Brush Unit Apparatus and Method," filed on Dec. 18, 2003.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for semiconductor wafer processing, comprising:
   providing liquid to a proximity head;
   heating the liquid within a heating portion of the proximity head, wherein the heating portion is configured to control a temperature of the liquid flowing therethrough, wherein the proximity head includes:
      a sensor disposed within the proximity head;
      a channel disposed in the heating portion, the channel being configured to guide the liquid through the heating portion; and
      a bottom surface having a plurality of outlet ports and a plurality of vacuum inlet ports, the plurality of outlet ports being in fluid communication with the channel disposed in the heating portion; and
   delivering the heated liquid to a surface of a semiconductor wafer for use in a wafer processing operation, wherein the plurality of outlet ports and the plurality of vacuum inlet ports open to a liquid meniscus supported between the bottom surface of the proximity head and the surface of a semiconductor wafer.

2. The method of claim 1, wherein the wafer processing operation is a cleaning operation.

3. The method of claim 2, wherein the liquid used in the cleaning operation is one of a cleaning chemistry and deionized water (DIW).

4. The method of claim 1, wherein the wafer processing operation is an etching operation.

5. The method of claim 4, wherein the liquid used in the etching operation is an etching chemistry.

6. The method of claim 1, wherein the wafer processing operation is a plating operation.

7. The method of claim 1, wherein the heating of the liquid within the proximity head further includes:
controlling a temperature of the liquid within the proximity head.

8. The method of claim 7, wherein the controlling of the temperature of the liquid within the proximity head further includes:
monitoring the temperature of the liquid within the proximity head; and
adjusting the heating of the liquid to maintain the temperature of the liquid at a desired temperature.

9. The method of claim 8, wherein monitoring the temperature of the liquid within the proximity head includes monitoring the temperature of the liquid within the proximity head with a sensor and coupling the sensor output to a controller, the controller being configured to adjust the heating of the liquid in the heating portion.

10. The method of claim 1, further including:
removing the heated liquid from the surface of the semiconductor wafer.

11. The method of claim 1, wherein the proximity head includes:
a bottom surface having a plurality of outlet ports and a plurality of vacuum inlet ports, the plurality of outlet ports being in fluid communication with a channel disposed in the heating portion, and the plurality of outlet ports and the plurality of vacuum inlet ports opening to a liquid meniscus supported between the bottom surface of the proximity head and a surface of a semiconductor wafer, wherein the plurality of vacuum inlet ports surrounds the plurality of outlet ports.

12. The method of claim 11, wherein the channel in the heating portion is a first channel and the heating portion further includes a second channel, wherein the first channel and the second channel are separated by a material having sufficient thermal conductivity so that heat from a circulating liquid in the second channel can be exchanged with the liquid in the first channel.

13. The method of claim 1, wherein the heating portion is comprised of silicon carbide and is coupled to a power source.

14. The method of claim 1, wherein the heating portion is comprised of an insulating material having an electrically conductive material dispersed therein, the electrically conductive material being coupled to a power source.

15. The method of claim 14, wherein the insulating material is comprised of a ceramic material.

16. The method of claim 14, wherein the electrically conductive material comprises a wire.

17. A method for semiconductor wafer processing, comprising:
providing liquid to a proximity head including a heating portion;
heating the liquid within the heating portion of the proximity head; and
controlling a temperature of the liquid within the proximity head; and
delivering the heated liquid to a surface of a semiconductor wafer for use in a wafer processing operation including forming a meniscus between the proximity head and the surface of the semiconductor wafer, wherein the proximity head includes:
a bottom surface having a plurality of outlet ports and a plurality of vacuum inlet ports, the plurality of outlet ports being in fluid communication with a channel disposed in the heating portion, and the plurality of outlet ports and the plurality of vacuum inlet ports opening to a liquid meniscus supported between the bottom surface of the proximity head and a surface of a semiconductor wafer, wherein the plurality of vacuum inlet ports surrounds the plurality of outlet ports, wherein the channel in the heating portion is a first channel and the heating portion further includes a second channel, wherein the first channel and the second channel are separated by a material having sufficient thermal conductivity so that heat from a circulating liquid in the second channel can be exchanged with the liquid in the first channel.

* * * * *